(12) United States Patent
Hsu et al.

(10) Patent No.: US 11,916,126 B2
(45) Date of Patent: *Feb. 27, 2024

(54) SEMICONDUCTOR DEVICE AND MANUFACTURING METHOD THEREOF (71) Applicant: UNITED MICROELECTRONICS CORP., Hsin-Chu (TW)

(72) Inventors: Hui-Hsin Hsu, Tainan (TW); Huan-Chi Ma, Tainan (TW); Chien-Wen Yu, Kaohsiung (TW); Shih-Min Chou, Tainan (TW); Nien-Ting Ho, Tainan (TW); Ti-Bin Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/989,710

(22) Filed: Nov. 18, 2022

(65) Prior Publication Data

US 2023/0078993 A1 Mar. 16, 2023

Related U.S. Application Data (63) Continuation of application No. 17/353,830, filed on Jun. 22, 2021, now Pat. No. 11,538,917.

(30) Foreign Application Priority Data

May 25, 2021 (CN) .......................... 202110570332.3

(51) Int. Cl.
*H01L 29/49* (2006.01)
*H01L 29/423* (2006.01)
*H01L 29/40* (2006.01)
*H01L 29/66* (2006.01)

(52) U.S. Cl.
CPC ........ *H01L 29/4966* (2013.01); *H01L 29/401* (2013.01); *H01L 29/42376* (2013.01); *H01L 29/66545* (2013.01)

(58) Field of Classification Search
CPC ............... H01L 29/4966; H01L 29/401; H01L 29/42376
See application file for complete search history.

(56) References Cited

U.S. PATENT DOCUMENTS

| | | | | |
|---|---|---|---|---|
| 6,028,003 A | * | 2/2000 | Frisa | .................... C23C 14/0641 438/653 |
| 7,915,127 B2 | | 3/2011 | Lin | |
| 2017/0365679 A1 | * | 12/2017 | None | .................. H01L 29/4966 |

(Continued)

*Primary Examiner* — Christine A Enad
(74) *Attorney, Agent, or Firm* — Winston Hsu (57) ABSTRACT

A semiconductor device includes a substrate and a gate structure. The gate structure is disposed on the substrate, and the gate structure includes a titanium nitride barrier layer a titanium aluminide layer, and a middle layer. The titanium aluminide layer is disposed on the titanium nitride barrier layer, and the middle layer is disposed between the titanium aluminide layer and the titanium nitride barrier layer. The middle layer is directly connected with the titanium aluminide layer and the titanium nitride barrier layer, and the middle layer includes titanium and nitrogen. A concentration of nitrogen in the middle layer is gradually decreased in a vertical direction towards an interface between the middle layer and the titanium aluminide layer.

17 Claims, 4 Drawing Sheets (56) References Cited

U.S. PATENT DOCUMENTS

2019/0096681 A1\* 3/2019 Wei .................. H01L 21/32134
2020/0132915 A1\* 4/2020 Chu ..................... G02B 6/0055
2020/0135915 A1 4/2020 Savant \* cited by examiner

SEMICONDUCTOR DEVICE AND MANUFACTURING METHOD THEREOF

CROSS REFERENCE TO RELATED APPLICATIONS

This application is a continuation application of U.S. application Ser. No. 17/353,830, filed on Jun. 22, 2021. The content of the application is incorporated herein by reference.

BACKGROUND OF THE INVENTION

1. Field of the Invention

The present invention relates to a semiconductor device and a manufacturing method thereof, and more particularly, to a semiconductor device including a gate structure and a manufacturing method thereof.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. Generally, poly-silicon is conventionally used as a gate electrode in semiconductor devices, such as the metal-oxide-semiconductor (MOS). With the trend towards scaling down the size of semiconductor devices, however, conventional poly-silicon gates face problems such as inferior performance due to boron penetration and unavoidable depletion effects. This increases equivalent thickness of the gate dielectric layer, reduces gate capacitance and worsens a driving force of the devices. Therefore, work function metals that are suitable for use as the high-k gate dielectric layer are used to replace the conventional poly-silicon gate to be the control electrode. Generally, metal gate stack structures including the work function metal and the high-k gate dielectric layer are formed by a replacement metal gate (RMG) process. The quality of the metal gate and the operation performance of the corresponding semiconductor device may be directly influenced by the RMG process. Therefore, how to improve the manufacturing yield of the semiconductor device through the design of gate structure and/or the process design related to the RMG process is a continuous issue for those in the related fields.

SUMMARY OF THE INVENTION

A semiconductor device and a manufacturing method thereof are provided in the present invention.

According to an embodiment of the present invention, a semiconductor device is provided. The semiconductor device includes a substrate and a gate structure. The gate structure is disposed on the substrate, and the gate structure includes a titanium nitride barrier layer, a titanium aluminide layer, and a middle layer. The titanium aluminide layer is disposed on the titanium nitride barrier layer, and the middle layer is disposed between the titanium aluminide layer and the titanium nitride barrier layer. The middle layer is directly connected with the titanium aluminide layer and the titanium nitride barrier layer, and the middle layer includes titanium and nitrogen. A concentration of nitrogen in the middle layer is gradually decreased in a vertical direction towards an interface between the middle layer and the titanium aluminide layer.

According to an embodiment of the present invention, a manufacturing method of a semiconductor device is provided. The manufacturing method includes the following steps. A gate structure is formed on a substrate, and the gate structure includes a titanium nitride barrier layer and a titanium aluminide layer. The titanium aluminide layer is disposed on the titanium nitride barrier layer. The step of forming the gate structure includes forming a titanium nitride layer on the substrate and forming a titanium layer on the titanium nitride layer. A thickness of the titanium layer is greater than a thickness of the titanium nitride layer, and at least a part of the titanium nitride layer becomes the titanium nitride barrier layer after the titanium layer is formed.

According to an embodiment of the present invention, a semiconductor device is provided. The semiconductor device includes a substrate and a gate structure. The gate structure is disposed on the substrate, and the gate structure includes a titanium nitride barrier layer and a titanium aluminide layer. The titanium aluminide layer is disposed on the titanium nitride barrier layer. The titanium nitride barrier layer directly contacts the titanium aluminide layer, and a concentration of nitrogen in a top portion of the titanium nitride barrier layer is gradually decreased in a vertical direction towards an interface between the titanium nitride barrier layer and the titanium aluminide layer.

According to an embodiment of the present invention, a manufacturing method of a semiconductor device is provided. The manufacturing method includes the following steps. A gate structure is formed on a substrate, and the gate structure includes a titanium nitride barrier layer and a titanium aluminide layer. The titanium aluminide layer is disposed on the titanium nitride barrier layer. The step of forming the gate structure includes forming a titanium nitride layer on the substrate and forming a titanium layer on the titanium nitride layer. A thickness of the titanium layer is greater than a thickness of the titanium nitride layer. A middle layer is formed between the titanium nitride barrier layer and the titanium layer, the middle layer is directly connected with the titanium layer and the titanium nitride barrier layer, and the middle layer comprises titanium and nitrogen.

According to an embodiment of the present invention, a manufacturing method of a semiconductor device is provided. The manufacturing method includes the following steps. A gate structure is formed on a substrate, and the gate structure includes a titanium nitride barrier layer and a titanium aluminide layer. The titanium aluminide layer is disposed on the titanium nitride barrier layer. The step of forming the gate structure includes forming a titanium nitride layer on the substrate; forming a titanium layer on the titanium nitride layer, wherein a thickness of the titanium layer is greater than a thickness of the titanium nitride layer; forming an aluminum layer on the titanium layer; and performing a reflow process after the step of forming the aluminum layer. The titanium layer and a portion of the aluminum layer is converted into the titanium aluminide layer after the reflow process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-6 are schematic drawings illustrating a manufacturing method of a semiconductor device according to an embodiment of the present invention, wherein

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
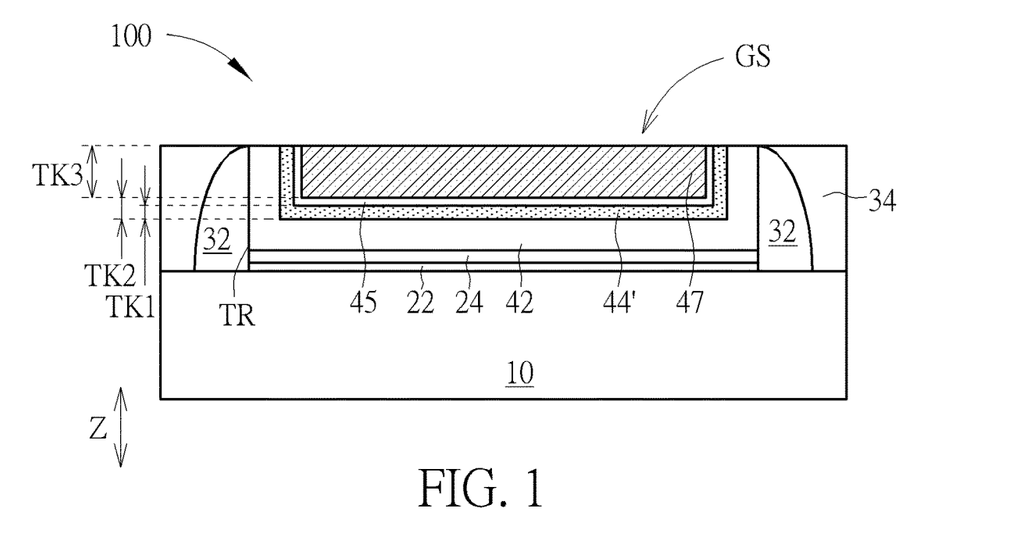
FIG. 1 is a schematic drawing illustrating a semiconductor device according to an embodiment of the present invention.

Please refer to FIG. 1. FIG. 1 is a schematic drawing illustrating a semiconductor device 100 according to an embodiment of the present invention. As shown in FIG. 1, the semiconductor device 100 includes a substrate 10 and a gate structure GS. The gate structure GS is disposed on the substrate 10, and the gate structure GS includes a titanium nitride (TiNx) barrier layer 44' and a titanium aluminide (TiAlx) layer 47. The titanium aluminide layer 47 is disposed on the titanium nitride barrier layer 44', and a thickness of the titanium aluminide layer 47 (such as a thickness TK3 shown in FIG. 1) ranges from twice a thickness of the titanium nitride barrier layer 44' (such as a thickness TK1 shown in FIG. 1) to three times the thickness of the titanium nitride barrier layer 44' (such as the thickness TK1). In other words, the titanium aluminide layer 47 may be thicker than the titanium nitride barrier layer 44'. The related manufacturing issues of the gate structure GS may be improved and the manufacturing yield of the semiconductor device 100 may be enhanced by controlling the proportion of the thickness TK3 of the titanium aluminide layer 47 to the thickness TK1 of the titanium nitride barrier layer 44'. For example, the thickness TK3 of the titanium aluminide layer 47 may be greater than or equal to twice the thickness TK1 of the titanium nitride barrier layer 44' and less than or equal to three times the thickness TK1 of the titanium nitride barrier layer 44'. In other words, the ratio of the thickness TK3 of the titanium aluminide layer 47 to the thickness TK1 of the titanium nitride barrier layer 44' may range from 2 to 3.

In some embodiments, a vertical direction (such as a direction Z shown in FIG. 1) may be regarded as a thickness direction of the substrate 10. The substrate 10 may have a top surface and a bottom surface opposite to the top surface in the direction Z, and the gate structure GS may be disposed at a side of the top surface, but not limited thereto. Horizontal directions substantially orthogonal to the direction Z may be substantially parallel with the top surface and/or the bottom surface of the substrate 10, but not limited thereto. Additionally, in this description, a distance between the bottom surface of the substrate 10 and a relatively higher location and/or a relatively higher part in the vertical direction (such as the direction Z) is greater than a distance between the bottom surface of the substrate 10 and a relatively lower location and/or a relatively lower part in the direction Z. The bottom or a lower portion of each component may be closer to the bottom surface of the substrate 10 in the direction Z than the top or upper portion of this component. Another component disposed above a specific component may be regarded as being relatively far from the bottom surface of the substrate 10 in the direction Z, and another component disposed under a specific component may be regarded as being relatively closer to the bottom surface of the substrate 10 in the direction Z, but not limited thereto.

In some embodiments, the substrate 10 may include a semiconductor substrate, such as a silicon substrate, an epitaxial silicon substrate, a silicon germanium substrate, a silicon carbide substrate, a silicon-on-insulator (SOI) substrate, or a semiconductor substrate made of other suitable materials and/or structures. A semiconductor unit (such as a transistor unit) may be formed with the gate structure GS, a part of the substrate 10, and other components formed in the substrate 10 and/or formed on the substrate 10 (such as a source/drain structure, not illustrated), but not limited thereto. In some embodiments, the gate structure GS may be formed by a replacement metal gate (RMG) process, but not limited thereto. For example, the semiconductor device 100 may further include a spacer structure 32 and a dielectric layer 34 disposed on the substrate 10. A trench TR may be located above the substrate 10 and surrounded by the spacer structure 32, the trench TR may be formed by removing a dummy gate, and the gate structure GS may be disposed in the trench TR, but not limited thereto. The spacer structure 32 may include a single layer or multiple layers of insulation materials, such as silicon oxide, silicon nitride, silicon oxynitride, or other suitable insulation materials, and the dielectric layer 34 may include silicon oxide or other suitable insulation materials.

In some embodiments, the gate structure GS may further include a gate dielectric layer 22, a bottom barrier layer 24, and a work function layer 42. The work function layer 42 may be disposed under the titanium nitride barrier layer 44', the bottom barrier layer 24 may be disposed under the work function layer 42, and the gate dielectric layer 22 disposed under the bottom barrier layer 24. The gate dielectric layer 22 may include a high dielectric constant (high-k) dielectric layer, such as hafnium oxide ($HfO_2$), hafnium silicon oxide (HfSiO$_4$), hafnium silicon oxynitride (HfSiON), aluminum oxide (Al$_2$O$_3$), tantalum oxide (Ta$_2$O$_5$), zirconium oxide (ZrO$_2$), or other suitable high-k materials. The bottom barrier layer 24 may include tantalum nitride, titanium nitride, or other suitable electrical conductive barrier materials. The work function layer 42 may include a single layer or multiple layers of work function materials, such as tantalum nitride, titanium nitride, titanium carbide, titanium aluminide, titanium aluminum carbide, or other suitable n-type and/or p-type work function materials.

In some embodiments, the work function layer 42, the titanium nitride barrier layer 44', and the titanium aluminide layer 47 may respectively include a U-shaped structure in a cross-sectional diagram of the gate structure GS, and the bottom barrier layer 24 and the gate dielectric layer 22 may be formed before the step of forming the dummy gate described above and may respectively include a line shaped structure in the cross-sectional diagram of the gate structure GS, but not limited thereto. In some embodiments, the bottom barrier layer 24 and the gate dielectric layer 22 may be formed after the step of forming the trench TR and may respectively include a U-shaped structure in a cross-sectional diagram of the gate structure GS. In some embodiments, the gate structure GS may be a structure formed with the gate dielectric layer 22, the bottom barrier layer 24, the work function layer 42, the titanium nitride barrier layer 44', and the titanium aluminide layer 47 stacked sequentially in the direction Z, and the titanium aluminide layer 47 may be regarded as the topmost layer in the gate structure GS accordingly.

In some embodiments, the gate structure GS may further include a middle layer 45 disposed between the titanium aluminide layer 47 and the titanium nitride barrier layer 44'. The middle layer 45 may be directly connected with the titanium aluminide layer 47 and the titanium nitride barrier layer 44', and the middle layer 45 may include titanium and nitrogen. In some embodiments, a concentration of nitrogen in the middle layer 45 may be gradually decreased in a vertical direction (such as the direction Z) towards an interface between the middle layer 45 and the titanium aluminide layer 44'. The concentration of nitrogen in the middle layer 45 may be lower than a concentration of nitrogen in the titanium nitride barrier layer 44', and the concentration of nitrogen described above may include atomic percentage of nitrogen or other suitable concentration units. In addition, the thickness of the middle layer 45 may be less than the thickness TK1 of the titanium nitride barrier layer 44' and the thickness TK3 of the titanium aluminide layer 47, and the middle layer 45 may be regarded as a transition layer where nitrogen from the titanium nitride layer 44' diffuses outwards, but not limited thereto. In some embodiments, the titanium nitride barrier layer 44' and the middle layer 45 may be regarded as a titanium nitride barrier layer, this titanium nitride barrier layer may directly contact the titanium aluminide layer 45 accordingly, and a concentration of nitrogen in a top portion of this titanium nitride barrier layer (such as the middle layer) is gradually decreased in a vertical direction (such as the direction Z) towards an interface between this titanium nitride barrier layer and the titanium aluminide layer 47. The thickness TK3 of the titanium aluminide layer 47 may be greater than or equal to twice the thickness of this titanium nitride barrier layer (such as a thickness TK2 shown in FIG. 1) and less than or equal to three times the thickness TK2 of this titanium nitride barrier layer, but not limited thereto.

Figure 2:
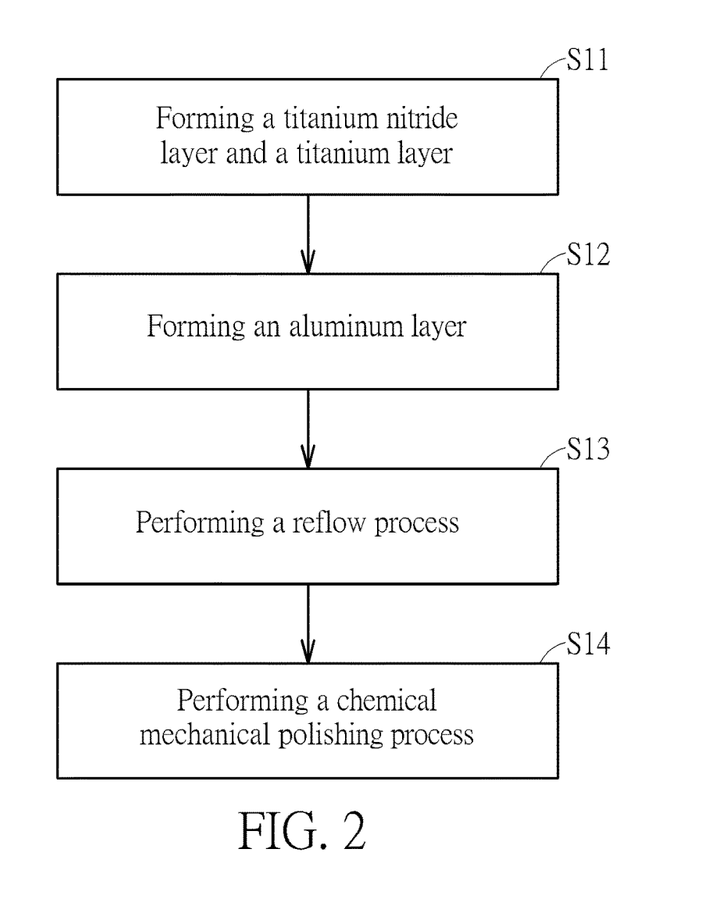
FIG. 2 is a schematic flow chart of a manufacturing method of a semiconductor device according to an embodiment of the present invention.
Figure 3:
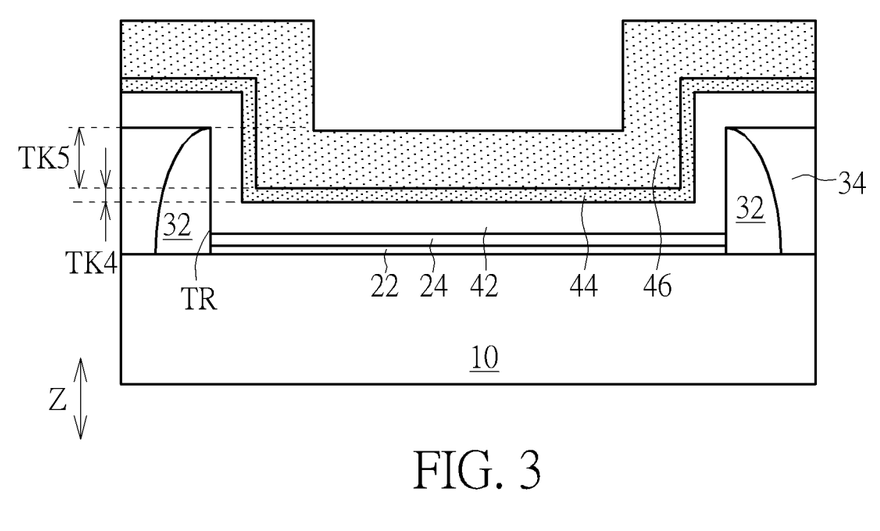
Figure 4:
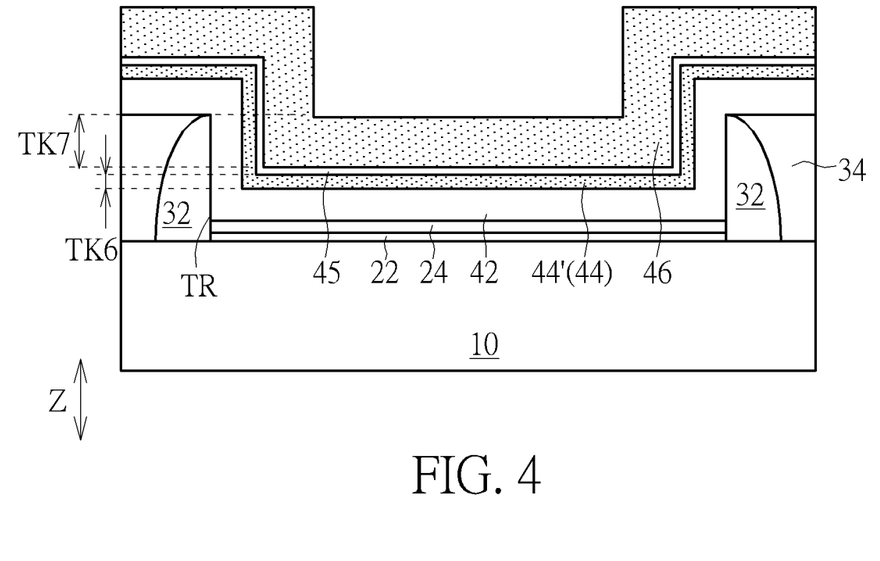
FIG. 4 is a schematic drawing in a step subsequent to FIG. 3.
Figure 5:
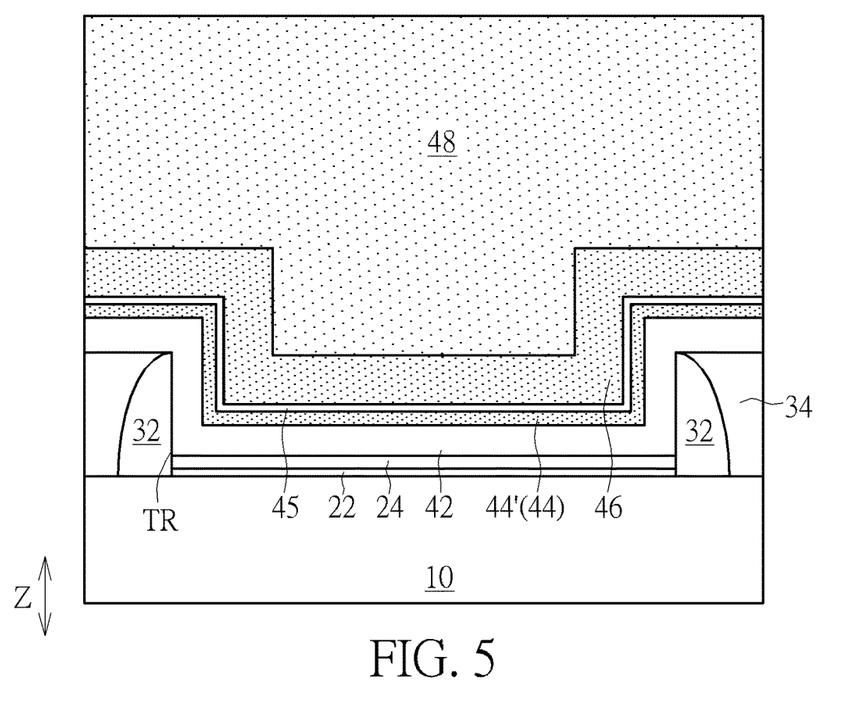
FIG. 5 is a schematic drawing in a step subsequent to FIG. 4.
Figure 6:
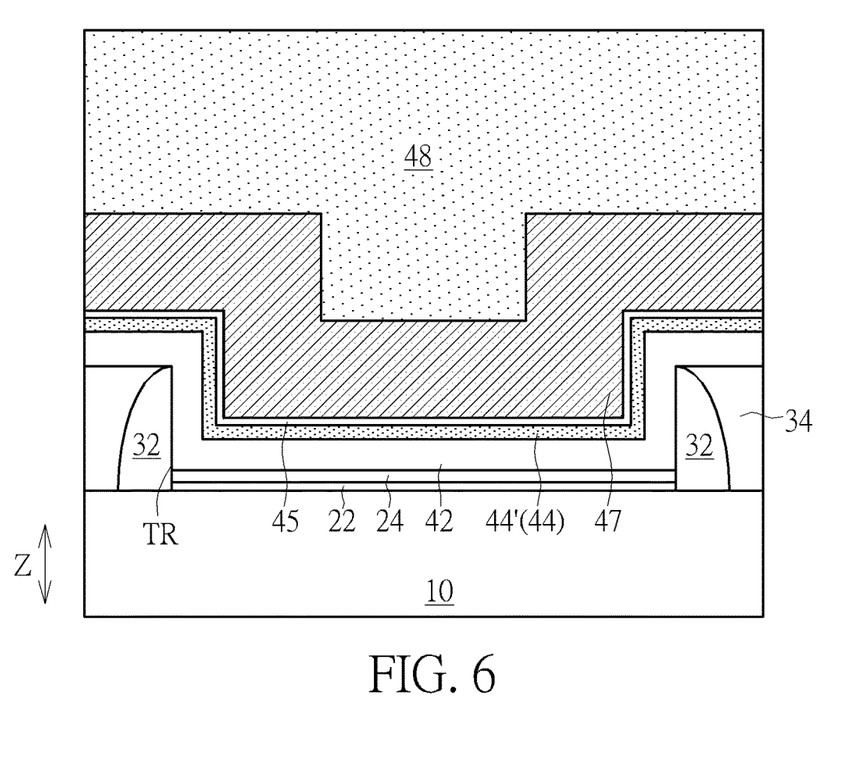
FIG. 6 is a schematic drawing in a step subsequent to FIG. 5.

Please refer to FIGS. 1-6. FIG. 2 is a schematic flow chart of a manufacturing method of a semiconductor device according to an embodiment of the present invention, and FIGS. 3-6 are schematic drawings illustrating a manufacturing method of a semiconductor device according to an embodiment of the present invention, wherein FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 1 may be regarded as a schematic drawing in a step subsequent to FIG. 6, but not limited thereto. As shown in FIG. 1, the manufacturing method of the semiconductor device in this embodiment may include the following steps. The gate structure GS is formed on the substrate 10, and the gate structure GS includes the titanium nitride barrier layer 44' and the titanium aluminide layer 47. The titanium aluminide layer 47 is disposed on the titanium nitride barrier layer 44', and the thickness TK3 of the titanium aluminide layer 47 ranges from twice the thickness TK1 of the titanium nitride barrier layer 44' to three times the thickness TK1 of the titanium nitride barrier layer 44'.

Specifically, the manufacturing method of the semiconductor device may include but is not limited to the following steps. As shown in FIG. 2 and FIG. 3, after the spacer structure 32, the dielectric layer 34, and the trench TR are formed on the substrate 10, step S11 may be carried out to form a titanium nitride layer 44 and a titanium layer 46 on the substrate 10, and the titanium layer 46 is formed on the titanium nitride layer 44. In some embodiments, the gate dielectric layer 22, the bottom barrier layer 24, and a dummy gate (not illustrated) may be formed on the substrate 10, the spacer structure 32 and the dielectric layer 34 may be formed subsequently, and the dummy gate may be removed for forming the trench TR. The work function layer 42, the titanium nitride layer 44, and the titanium layer 46 may be formed after the step of forming the trench TR, and at least a part of the work function layer 42, at least a part of the titanium nitride layer 44, and at least a part of the titanium layer 46 may be formed in the trench TR, but not limited thereto. The manufacturing approach described above may be regarded as a high-k first process, but the manufacturing method of the gate structure in the present invention is not limited to this. In some embodiments, the dummy gate (not illustrated), the spacer structure 32, and the dielectric layer 34 may be formed on the substrate 10, the dummy gate may then be removed for forming the trench TR, and the gate dielectric layer 22, the bottom barrier layer 24, the work function layer 42, the titanium nitride layer 44, and the titanium layer 46 may be formed after the step of forming the trench TR. At least a part of the gate dielectric layer 22, at least a part of the bottom barrier layer 24, at least a part of the work function layer 42, at least a part of the titanium nitride layer 44, and at least a part of the titanium layer 46 may be formed in the trench TR, and this manufacturing approach may be regarded as a high-k last process, but not limited thereto.

In some embodiments, by controlling the film forming thickness proportion of the titanium nitride layer 44 to the titanium layer 46, the thickness of the titanium layer 46 may be increased while the titanium nitride layer 44 has a specific thickness for providing the required barrier effect, and the titanium layer 46 may then provide enough titanium for inter-diffusion with aluminum from an aluminum layer subsequently formed on the titanium layer 46 and forming the required titanium aluminide layer accordingly. Comparatively, when the thickness ratio of the titanium nitride layer 44 is relatively high, titanium in the titanium layer 46 tends to be constrained by the titanium nitride layer 44 and the inter-diffusion between the titanium and the aluminum in the aluminum layer cannot be effectively realized. Accordingly, unevenness in the surface, thickness, and/or composition of the formed titanium aluminide layer may be generated and that may in turn cause related process problems, such as the dishing issue on the aluminum layer in the chemical mechanical polishing process and/or air void in the aluminum layer. Therefore, the process problems described above may be improved by increase the thickness ratio of the titanium layer 46 under the condition that the titanium nitride layer 44 has a certain thickness ratio to provide the desired barrier effect, and the purposes of improving manufacturing yield, enhancing the electrical performance of the semiconductor device, and/or enhancing the reliability of the semiconductor device may be achieved accordingly. In some embodiments, a thickness of the titanium layer 46 (such as a thickness TK5 shown in FIG. 3) may be greater than a thickness of the titanium nitride layer 44 (such as a thickness TK4 shown in FIG. 3), and the thickness TK5 of the titanium layer 46 may be less than or equal to five times the thickness TK4 of the titanium nitride layer 44.

As shown in FIG. 3 and FIG. 4, in some embodiments, at least a part of the titanium nitride layer 44 may become the titanium nitride barrier layer 44' after the step of forming the titanium layer 46, and a middle layer 56 may be formed between the titanium layer 46 and the titanium nitride barrier layer 44'. In some embodiments, the middle layer 45 may be regarded as a material layer formed by inter-diffusion between the titanium nitride layer 44 and the titanium layer 46, the middle layer 45 may be directly connected with the titanium layer 46 and the titanium nitride barrier layer 44' accordingly, and the middle layer 45 may include titanium and nitrogen. Therefore, after the middle layer 45 is formed, the titanium nitride layer 44 and the titanium layer 46 may become relatively thinner, but the thickness of the titanium layer 46 (such as a thickness TK7 shown in FIG. 4) may still be greater than the thickness of the titanium nitride layer 44 (such as a thickness TK6 shown in FIG. 4). In some embodiments, after the middle layer is formed, the thickness TK7 of the titanium layer 46 may range from twice the thickness TK6 of the titanium nitride layer 44 to three times the thickness TK6 of the titanium nitride layer 44. In other words, the thickness TK7 of the titanium layer 46 may be greater than or equal to twice the thickness TK6 of the titanium nitride layer 44 and less than or equal to three times the thickness TK6 of the titanium nitride layer 44, and the ratio of the thickness TK7 to the thickness TK6 (TK7/TK6) may range from 2 to 3, but not limited thereto. Additionally, in some embodiments, the concentration of nitrogen in the middle layer 45 may be gradually decreased in a vertical direction (such as the direction Z) towards an interface between the middle layer 45 and the titanium layer 46, but not limited thereto.

Subsequently, as shown in FIG. 2, FIG. 4, and FIG. 5, step S12 may be carried out for forming an aluminum layer 48 on the titanium layer 46, and a thickness of the aluminum layer 46 is greater than the thickness of the titanium layer 46. As shown in FIG. 2, FIG. 5, and FIG. 6, step S13 may then be carried out for performing a reflow process after the step of forming the aluminum layer 48. In some embodiments, the reflow process may include a thermal reflow process or other approaches capable of providing the desired reflow effect. The voids in the aluminum layer 48 may move upwards to be located in an area adjacent to the top surface of the aluminum layer 48 by the reflow process, the inter-diffusion between the aluminum layer 48 and the titanium layer 46 may be accelerated by the reflow process, and the titanium layer 46 and a portion of the aluminum layer 48 may be converted into the titanium aluminide layer 47 after the reflow process accordingly. Therefore, in some embodiments, the titanium aluminide layer 47 may be partly formed in the trench TR above the substrate 10 and partly formed outside the trench TR, but not limited thereto. In some embodiments, the reflow process described above and the film forming process of the aluminum layer 48 may be carried out in the same process chamber, and the reflow process may be performed right after the film forming process of the aluminum layer 48 for reducing the negative influence of outer environment and the influence on the total process time, especially when the process time of the reflow process has to be increased for achieving the effects described above, but not limited thereto.

As shown in FIG. 6, FIG. 1, and FIG. 2, step S14 may then be carried out for performing a chemical mechanical polishing (CMP) process after the reflow process so as to remove the titanium aluminide layer 47, the middle layer 45, the titanium nitride barrier layer 44', and the work function layer 42 located outside the trench TR and form the gate structure GS accordingly. In some embodiments, the aluminum layer 48 may be completely removed by the chemical mechanical polishing process described above, and the titanium aluminide layer 47 may be a topmost layer in the gate structure accordingly, such as the topmost layer in a center area of the gate structure, but not limited thereto. In some embodiments, a part of the aluminum layer 48 may remain on the titanium aluminide layer 47 after the chemical mechanical polishing process, and the gate structure GS may include the aluminum layer 48 disposed on the titanium aluminide layer 47 accordingly, but not limited thereto. Additionally, in some embodiments, because the thickness of the titanium layer may be greater than or equal to twice the thickness of the titanium nitride layer and less than or equal to three times the thickness of the titanium nitride layer before the aluminum 48 is formed, the thickness TK3 of the titanium aluminide layer 47 in the gate structure GS may range from twice the thickness TK1 of the titanium nitride barrier layer 44' to three times the thickness TK1 of the titanium nitride barrier layer 44' after the gate structure GS is formed.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 7:
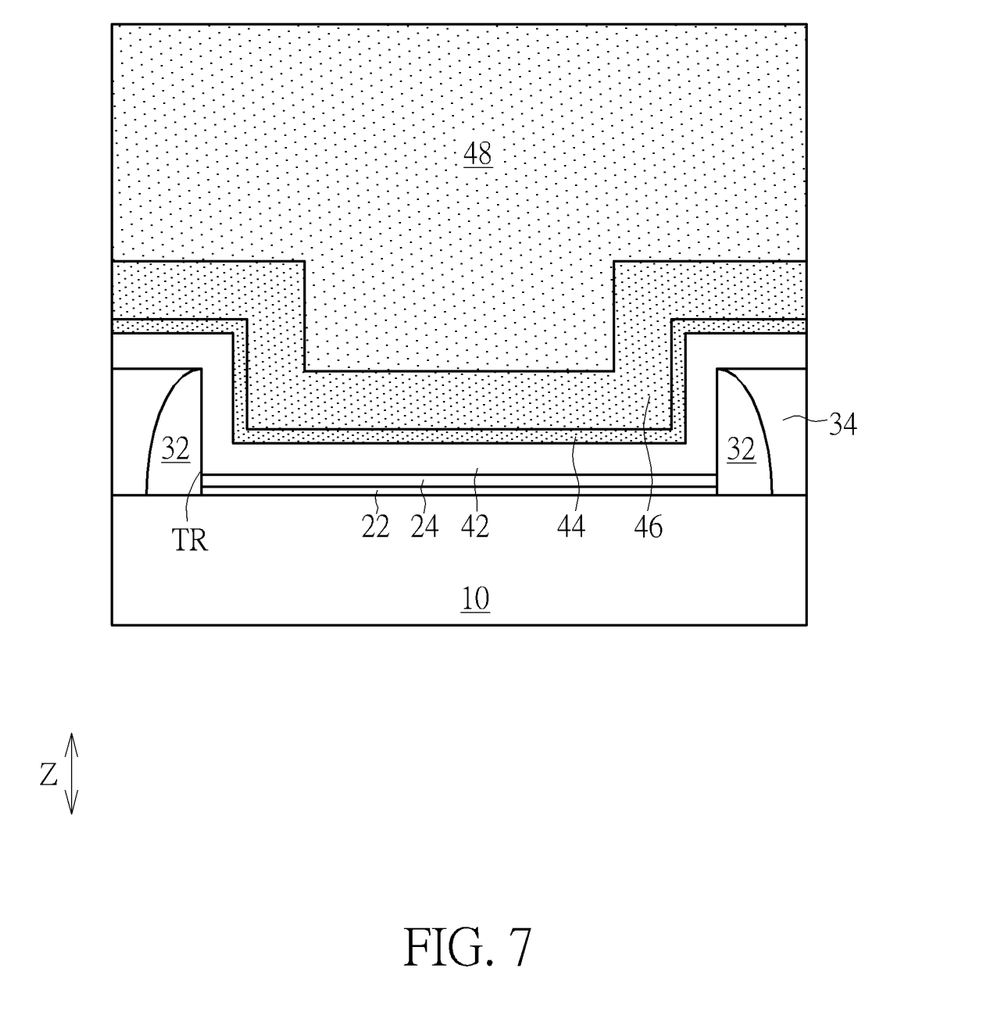
FIG. 7 is a schematic drawing illustrating a manufacturing method of a semiconductor device according to another embodiment of the present invention.

Please refer to FIG. 7, FIG. 3, and FIG. 5. FIG. 7 is a schematic drawing illustrating a manufacturing method of a semiconductor device according to another embodiment of the present invention. In some embodiments, FIG. 7 may be regarded as a schematic drawing in a step subsequent to FIG. 3, and FIG. 5 may be regarded as a schematic drawing in a step subsequent to FIG. 7. As shown in FIG. 3 and FIG. 7, in some embodiments, there may be not any middle layer apparently formed between the titanium layer 46 and the titanium nitride layer 44 after the step of forming the aluminum layer 48. As shown in FIG. 7 and FIG. 5, in some embodiments, the middle layer 45 may be formed between the titanium layer 46 and the titanium nitride layer 44 after the reflow process performed to the aluminum layer 48, and at least a part of the titanium nitride layer 44 may become the titanium nitride barrier layer 44' after the reflow process, but not limited thereto.

To summarize the above descriptions, according to the semiconductor device and the manufacturing method thereof in the present invention, the titanium layer may provide more and enough titanium for inter-diffusion with aluminum from the aluminum layer so as to form the titanium aluminide layer with improved uniformity by controlling the film forming thickness proportion of the titanium nitride layer to the titanium layer and performing the reflow process before the chemical mechanical polishing process. The related process problems of the chemical mechanical polishing process may be improved, and the manufacturing yield and/or the reliability of the semiconductor device may be enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate; and
   a gate structure disposed on the substrate, wherein the gate structure comprises:
      a titanium nitride barrier layer;
      a titanium aluminide layer disposed on the titanium nitride barrier layer; and
      a middle layer disposed between the titanium aluminide layer and the titanium nitride barrier layer, wherein the middle layer is directly connected with the titanium aluminide layer and the titanium nitride barrier layer, and the middle layer comprises titanium and nitrogen,
      wherein a concentration of nitrogen in the middle layer is gradually decreased in a vertical direction towards an interface between the middle layer and the titanium aluminide layer.

2. The semiconductor device according to claim 1, wherein the titanium aluminide layer is the topmost layer in the gate structure.

3. The semiconductor device according to claim 1, wherein the gate structure further comprises:
   a work function layer disposed under the titanium nitride barrier layer;
   a bottom barrier layer disposed under the work function layer; and
   a gate dielectric layer disposed under the bottom barrier layer.

4. A manufacturing method of a semiconductor device, comprising:
   forming a gate structure on a substrate, wherein the gate structure comprises:
      a titanium nitride barrier layer; and
      a titanium aluminide layer disposed on the titanium nitride barrier layer, wherein the step of forming the gate structure comprises:
         forming a titanium nitride layer on the substrate; and
         forming a titanium layer on the titanium nitride layer, wherein a thickness of the titanium layer is greater than a thickness of the titanium nitride layer, and at least a part of the titanium nitride layer becomes the titanium nitride barrier layer after the titanium layer is formed.

5. The manufacturing method of the semiconductor device according to claim 4, wherein the thickness of the titanium layer ranges from twice the thickness of the titanium nitride layer to three times the thickness of the titanium nitride layer.

6. The manufacturing method of the semiconductor device according to claim 4, wherein a middle layer is formed between the titanium nitride barrier layer and the titanium layer, the middle layer is directly connected with the titanium layer and the titanium nitride barrier layer, and the middle layer comprises titanium and nitrogen.

7. The manufacturing method of the semiconductor device according to claim 6, wherein a concentration of nitrogen in the middle layer is gradually decreased in a vertical direction towards an interface between the middle layer and the titanium layer.

8. The manufacturing method of the semiconductor device according to claim 4, wherein the step of forming the gate structure further comprises:
   forming an aluminum layer on the titanium layer; and
   performing a reflow process after the step of forming the aluminum layer, wherein the titanium layer and a portion of the aluminum layer is converted into the titanium aluminide layer after the reflow process.

9. The manufacturing method of the semiconductor device according to claim 8, wherein the titanium aluminide layer is partly formed in a trench above the substrate and partly formed outside the trench, and the step of forming the gate structure further comprises:
   performing a chemical mechanical polishing process after the reflow process for removing the titanium aluminide layer located outside the trench.

10. The manufacturing method of the semiconductor device according to claim 9, wherein the aluminum layer is completely removed by the chemical mechanical polishing process.

11. The manufacturing method of the semiconductor device according to claim 4, wherein the titanium aluminide layer is the topmost layer in the gate structure.

12. A semiconductor device, comprising:
    a substrate; and
    a gate structure disposed on the substrate, wherein the gate structure comprises:
       a titanium nitride barrier layer; and
       a titanium aluminide layer disposed on the titanium nitride barrier layer, wherein the titanium nitride barrier layer directly contacts the titanium aluminide layer, and a concentration of nitrogen in a top portion of the titanium nitride barrier layer is gradually decreased in a vertical direction towards an interface between the titanium nitride barrier layer and the titanium aluminide layer.

13. A manufacturing method of a semiconductor device, comprising:
    forming a gate structure on a substrate, wherein the gate structure comprises:
       a titanium nitride barrier layer; and
       a titanium aluminide layer disposed on the titanium nitride barrier layer, wherein the step of forming the gate structure comprises:
          forming a titanium nitride layer on the substrate; and
          forming a titanium layer on the titanium nitride layer, wherein a thickness of the titanium layer is greater than a thickness of the titanium nitride layer,
          wherein a middle layer is formed between the titanium nitride barrier layer and the titanium layer, the middle layer is directly connected with the titanium layer and the titanium nitride barrier layer, and the middle layer comprises titanium and nitrogen.

14. The manufacturing method of the semiconductor device according to claim 13, wherein a concentration of nitrogen in the middle layer is gradually decreased in a vertical direction towards an interface between the middle layer and the titanium layer.

15. A manufacturing method of a semiconductor device, comprising:
forming a gate structure on a substrate, wherein the gate structure comprises:
a titanium nitride barrier layer; and
a titanium aluminide layer disposed on the titanium nitride barrier layer, wherein the step of forming the gate structure comprises:
forming a titanium nitride layer on the substrate;
forming a titanium layer on the titanium nitride layer, wherein a thickness of the titanium layer is greater than a thickness of the titanium nitride layer;
forming an aluminum layer on the titanium layer; and
performing a reflow process after the step of forming the aluminum layer, wherein the titanium layer and a portion of the aluminum layer is converted into the titanium aluminide layer after the reflow process.

16. The manufacturing method of the semiconductor device according to claim 15, wherein the titanium aluminide layer is partly formed in a trench above the substrate and partly formed outside the trench, and the step of forming the gate structure further comprises:
performing a chemical mechanical polishing process after the reflow process for removing the titanium aluminide layer located outside the trench.

17. The manufacturing method of the semiconductor device according to claim 16, wherein the aluminum layer is completely removed by the chemical mechanical polishing process.

* * * * *